United States Patent [19]
Berger

[11] Patent Number: 4,716,580
[45] Date of Patent: Dec. 29, 1987

[54] CHARGE TRANSFER ANALOG COMPARATOR AND DEVICES USING SUCH A COMPARATOR

[75] Inventor: Jean L. Berger, Grenoble, France
[73] Assignee: Thomson-CSF, Paris, France
[21] Appl. No.: 745,883
[22] Filed: Jun. 18, 1985

[30] Foreign Application Priority Data

Jun. 26, 1984 [FR] France ................. 84 10047

[51] Int. Cl.[4] ............... G11C 19/28; H01L 29/78; H03M 1/00; H03K 5/153
[52] U.S. Cl. ........................ 377/62; 357/24; 340/347 AD; 307/362
[58] Field of Search ............ 357/24; 377/57–63; 340/347 AD; 307/355–362

[56] References Cited

U.S. PATENT DOCUMENTS

| 4,277,702 | 7/1981 | Hamilton et al. | 357/24 |
| 4,291,243 | 9/1981 | Hamilton et al. | 357/24 |
| 4,374,334 | 2/1983 | Engeler | 357/24 |
| 4,639,678 | 1/1987 | Schlig et al. | 357/24 |

OTHER PUBLICATIONS

L. M. Terman and Y. S. Yee *High Sensitivity Charge for Sensing and Comparing Very Small Charge Packets*, IBM Technical Disclosure Bulletin, vol. 21, No. 3, Aug. 1978 1262–1263.

L. G. Heller, L. M. Heller and Y. S. Yee *High Speed, High Sensitivity CCD Comparator*, IBM Technical Disclosure Bulletin, vol. 20, No. 5, Oct. 1977 2072–2073.

L. M. Terman and Y. S. Yee *CCD Multilevel Storage Detection Scheme*, IBM Technical Disclosure Bulletin vol. 22, No. 4, Dec. 1979, 2978–2979.

Primary Examiner—Gene M. Munson
Attorney, Agent, or Firm—Roland Plottel

[57] ABSTRACT

A charge transfer analog comparator comprising two adjacent MIS capacities coupled together by a passage gate and connected respectively to the input and to the output of an amplifier as well as the means for initializing the comparison connected to the input of an amplifier and means for introducing under each capacity respectively the signal charge and the reference charge.

15 Claims, 15 Drawing Figures

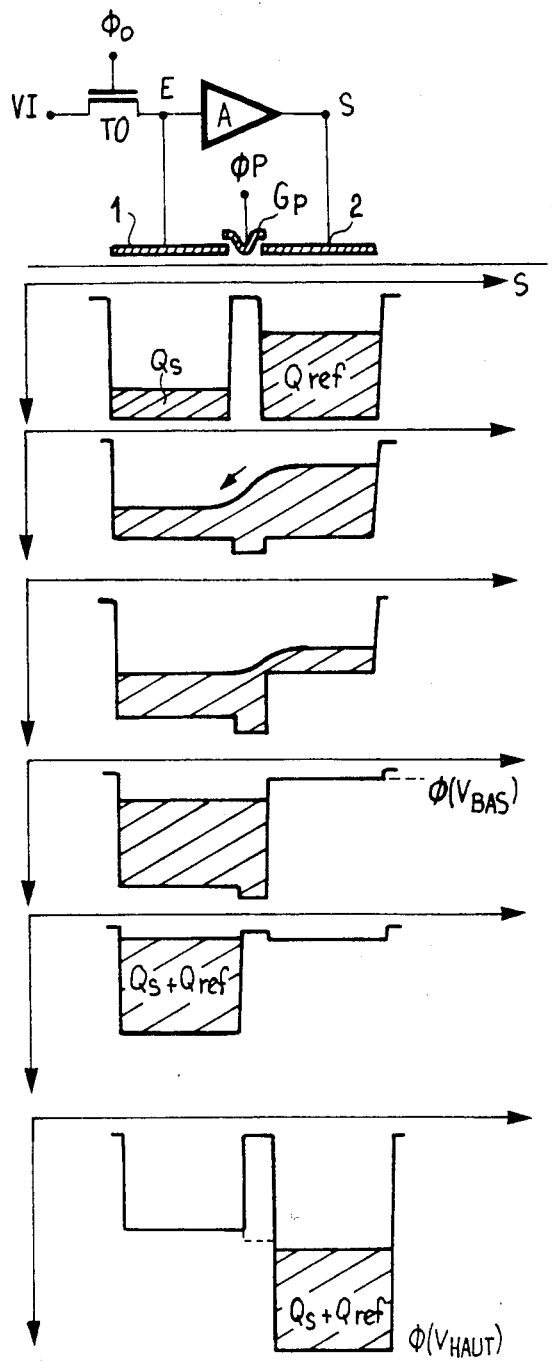

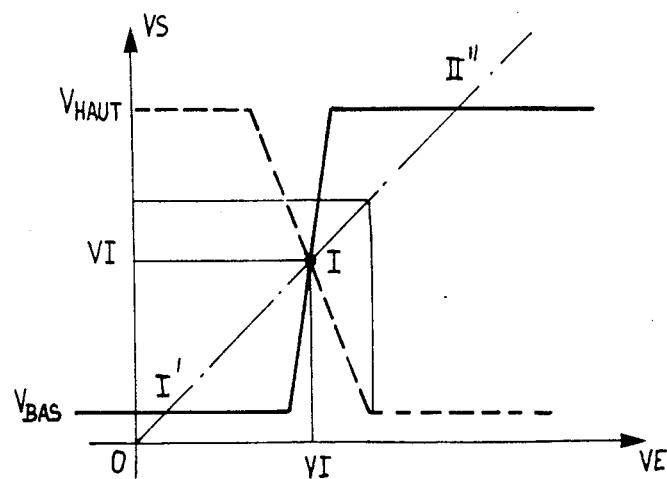
FIG_2
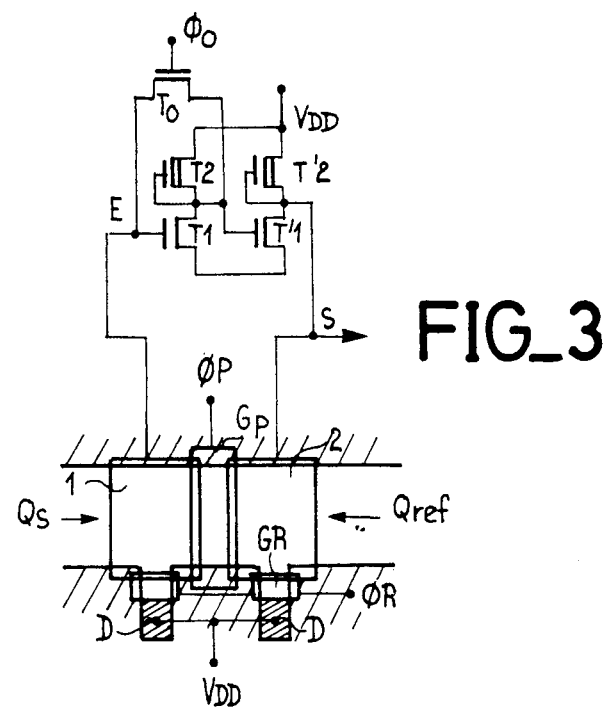
FIG_3

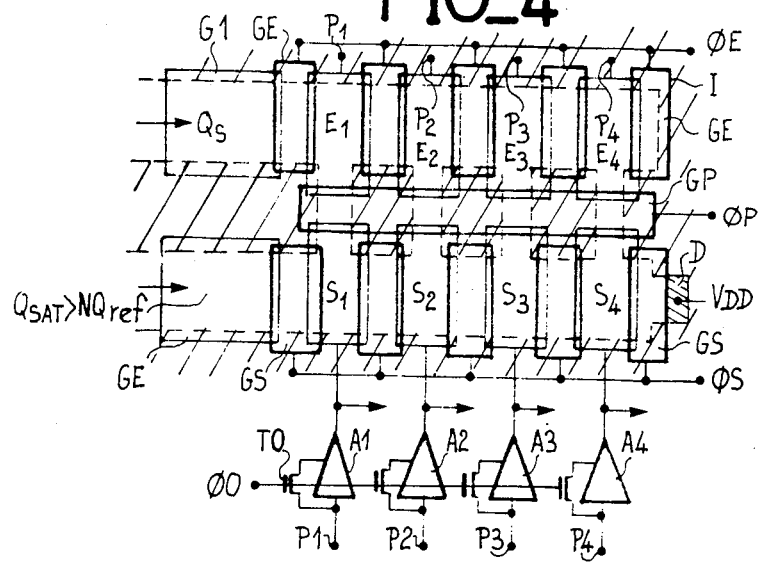
FIG_4
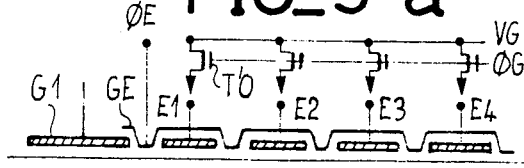
FIG_5-a
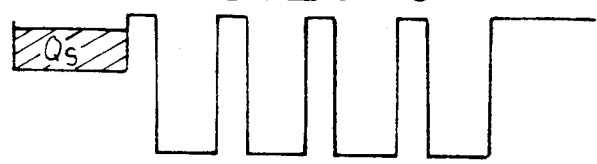
FIG_5-b
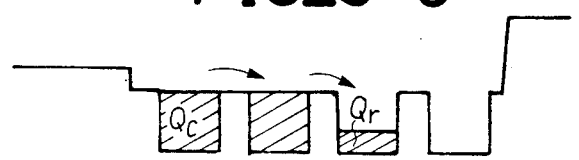
FIG_5-c
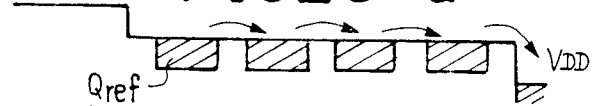
FIG_5-d FIG_6
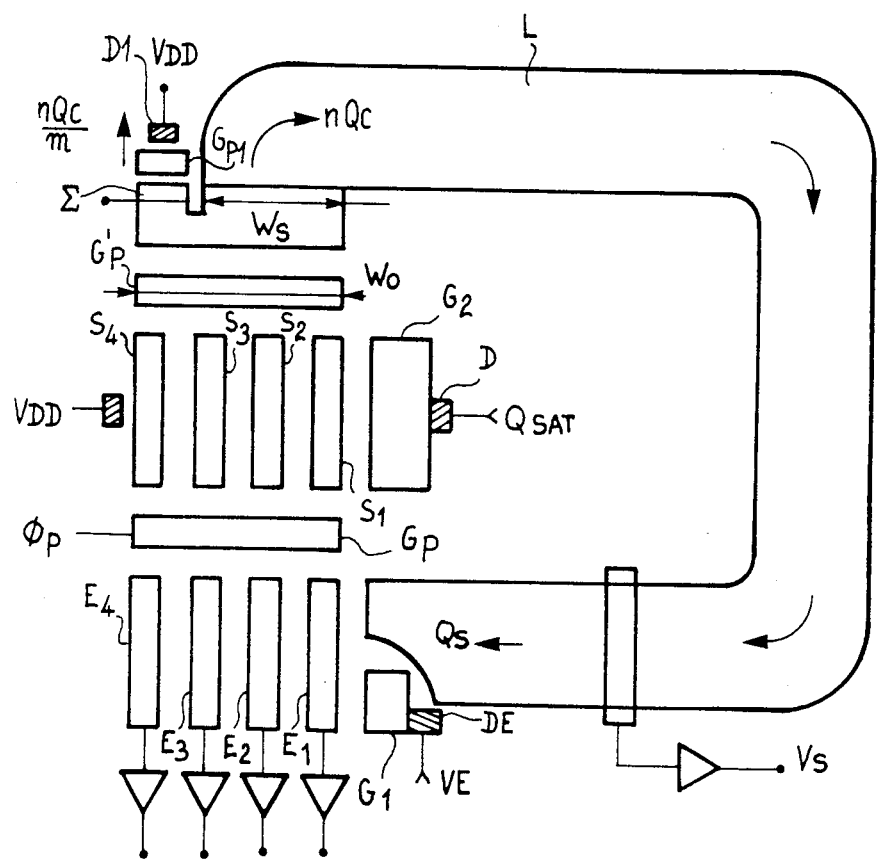

CHARGE TRANSFER ANALOG COMPARATOR AND DEVICES USING SUCH A COMPARATOR

BACKGROUND OF THE INVENTION

1. Field of the Invention

The present invention relates to a charge transfer analog comparator.

2. Description of the Prior Art

To the knowledge of the applicant, no such comparators exist at the present time.

However in some applications using charge transfer devices, it is sometimes necessary to compare two charge amounts with each other. This is in particular the case with charge transfer devices used as multilevel analog memories in which the information is stored in the form of calibrated charge packets which are periodically regenerated and reinjected. The calibration and recalibration operation during each reinjection is accomplished with N comparators which locate the position of the charge packet with respect to a reference signal corresponding to N reference charge packets. This operation is usually accomplished by converting the voltage charge packets and by using voltage comparators of a known type.

The purpose of the present invention is to overcome this disadvantage by providing a comparator which effects the comparison directly at the level of the charge packets and consequently avoids charge-voltage conversions.

SUMMARY OF THE INVENTION

Consequently, the present invention provides a charge transfer analog comparator comprising a means for receiving a signal charge amount and a reference charge amount and for comparing the two charge amounts directly with each other.

In a preferred embodiment, the charge transfer analog comparator of the present invention comprises two adjacent MIS capacitors coupled together by a passage gate and connected respectively to the input and to the output of an amplifier, a means for initializing the comparison connected to the input of the amplifier and means for introducing under each capacitor respectively the signal charge and the reference charge.

Since the charge amounts are no longer transformed into voltage, the analog comparator of the invention has very greater sensitivity.

The present invention also relates to the different devices using the above charge transfer analog comparator.

Thus, the present invention relates to an analogdigital converter using N comparator stages such as described above. It also relates to a multilevel analog memory, comprising comparators of the above type used as recalibrators.

BRIEF DESCRIPTION OF THE DRAWINGS

Other features and advantages of the present invention will be clear from reading the description of different embodiments made with reference to the accompanying drawings in which:

FIGS. 1a to 1g are respectively a schematical sectional view of a comparator in accordance with the present invention and diagrams showing the evolution of the surface potentials during the different stages of the comparison;

FIG. 2 shows the characteristic of an amplifier;

FIG. 3 is a detail diagram of the comparator of FIG. 1 in the case of voltage reading;

FIG. 4 is a top view of one embodiment of an analog-digital converter using comparators in accordance with the present invention;

FIGS. 5a to 5d are respectively a sectional view through V—V of FIG. 4 and diagrams showing the evolution of the surface potentials during operation of the converter, and FIG. 6 is a schematical top view of a multilevel analog memory comprising comparators in accordance with the present invention used for recalibration.

In the different Figures, the same references designate the same elements, however, for the sake of clarity, the sizes and proportions of the different elements have not been respected.

DESCRIPTION OF THE PREFERRED EMBODIMENTS

As shown in FIG. 1a, the charge transfer analog comparator of the present invention is formed mainly by two MIS capacitors 1 and 2 formed in a way known per se by the substrate S which may for example be made from p type silicon, an insulating layer made for example from silicon oxide and a gate made for example from polycrystalline silicon or aluminum. The two capacitors 1 and 2 are connected together by a channel in the substrate controlled by the passage gate $G_p$ connected to a periodic potential $\phi_p$. In addition, the gates of the two MIS capacitors 1 and 2 are connected respectively to the input E and to the output S of an amplifier A. Furthermore, an MOS transistor $T_O$ is used for initiating the comparison. Specifically, the drain of the MOS transistor $T_O$ is connected to a DC voltage $V_1$ chosen so as to position amplifier A at the level of its unstable point, as will be explained hereafter. The source of the MOS transistor $T_O$ is connected to the input of amplifier A and the gate of the MOS transistor is connected to a periodic potential $\phi_O$ which enables transistor $T_O$ during initiation of the comparison, i.e. during injection of the charge packets corresponding to the signal charge $Q_S$ and to the reference charge $Q_{ref}$ respectively under capacitors 1 and 2.

The voltage $V_I$ is chosen so as to position amplifier A at its unstable point as mentioned above. In fact, in order to obtain identical potential wells under the MOS capacitors 1 and 2, it is necessary for the input voltage of the amplifier applied to the gate of capacitor 1 to be equal to the output voltage of this amplifier applied to the gate of capacitor 2. Furthermore, so as to be able to detect a variation in the output voltage with respect to the input voltage, it is necessary to operate at the level of the unstable point of the characteristic of the amplifier illustrated by the continuous line shown in FIG. 2. In fact, the continuous line curve shows the characteristic $V_S$ as a function of $V_E$ of an amplifier. If we plot the first bissectrix, it can be seen that this bissectrix intersects the characteristic at three points referenced I', I, I''. For these three points $V_S = V_E$. However, if we operate at point I corresponding to the voltage $V_I$, it will be noticed that, for a slight imbalance of the voltage $V_S$ with respect to $V_E$, there is a swing towards the value of $V_S$ corresponding to $V_{haut}$ or towards the value of $V_S$ corresponding to $V_{bas}$ depending on the direction of the imbalance. Thus, for comparing two charge amounts stored under the capacitors 1 and 2, this possibility of swinging about the unstable point I is used, as will be explained in greater detail further on with reference to FIGS. 1b to 1g.

As shown in FIG. 1b, during initiation of the comparison, the voltage $\phi_O$ is at the high level so as to impose the voltage $V_I$ on the input of amplifier A. Since this voltage $V_I$ is the one for which the amplifier delivers an output voltage equal to the input voltage, voltage $V_I$ is also imposed on the output of the amplifier. The result is that the potential wells under capacitors 1 and 2 are equal. With the gate $\phi_p$ at a low level, the signal charge $Q_S$ is introduced under the gate of capacitor 1 and a reference charge $Q_{ref}$ under the gate of capacitor 2 using any charge introduction device of known type. The charge introduction device may be formed by a simple passage gate where the comparator is connected to a charge transfer device or by a device providing a voltage-charge conversion formed mainly by an injection diode when the signal is in the form of a voltage.

When the initialization is finished, the potential $\phi_O$ is then brought back to the low level so that the potential at point E applied to the gate of capacitor 1 becomes floating again. As shown in FIG. 1c, the potential $\phi_p$ of gate $G_p$ is brought to the higher level namely to a level higher than the level created by $V_I$, so that the charges may flow between the two adjacent capacitors. The potential well that is the most filled then flows charge into the adjacent well.

In the embodiment shown in FIG. 1-b, it has been assumed for example that $Q_{ref}$ is greater than $Q_S$. The charges flow therefore to capacitor 1, which lowers its potential. The amplifier A transmits this potential variation under the gate of capacitor 2. The result is that the surface potential under the gate of capacitor 2 decreases rapidly until it reaches the level $\phi$ ($V_{bas}$) as shown in FIGS. 1d and 1e.

Thus, after bringing the potential $\phi_p$ to the low level, the whole of the charges $Q_{ref}+Q_S$ are soon to be found on the side of the smallest charge, namely under capacitor 1 as shown in FIG. 1f.

If, instead of taking $Q_{ref}$ as being greater than $Q_S$, we take the condition of $Q_S$ greater than $Q_{ref}$, the charges flow from capacitor 1 to capacitor 2, which raises the potential of capacitor 1 and causes the amplifier A to swing to the level $V_{haut}$. In this case, the whole of the charges $Q_S+Q_{ref}$ are soon to be found under capacitor 2, namely on the side of the smallest charge as shown in FIG. 1g.

Consequently, depending on whether the signal charge $Q_S$ is less or greater than the reference charge $Q_{ref}$, the whole of the charges $Q_S+Q_{ref}$ are to be found either under capacitor 1 or under capacitor 2 and by reading the final state of the comparator either as a charge or as a voltage, the result of the comparison is therefore obtained.

In fact, the final state of the comparator may be read in two ways:

either as a voltage: in this case the point S at the output of the amplifier is at the high level if $Q_{ref}$ is less than $Q_S$ and point S is at the low level if $Q_{ref}$ is greater than $Q_S$, or as a charge: in this case, the whole of the charges $Q_S+Q_{ref}$ are soon to be found under the gate of the capacitor having the smallest initial charge.

With reference more particularly to FIG. 3 one embodiment of an amplifier will now be described which may be used in the present invention for obtaining a voltage $V_I$. In this case, the amplifier A is connected by means of two series connected inverters. More specifically, each inverter is formed by a MOS transistor $T_1$, $T'_1$ whose gate receivers the input signal and whose drain gives the output signal. Moreover, each drain is connected through a load resistance to a DC voltage $V_{DD}$. This load resistance is formed in the embodiment shown by a depletion MOS transistor $T_2$, $T'_2$ whose gate is looped to the source. If the two inverters $T_1$, $T_2$ and $T'_1$,$T'_2$ are identical, initial biasing to the voltage $V_I$ is simply obtained by short circuiting the first inverter $T_1$, $T_2$ by the MOS transistor $T_O$ namely by connecting the drain and the source of the MOS transistor $T_O$ respectively to the input and to the output of the first inverter $T_1$, $T_2$ as shown.

In fact, from the transfer characteristic of the inverter shown with a broken line in FIG. 2, it can be seen that the short circuited inverter has only one rest point I which delivers the voltage $V_I$ to the input and to the output of the amplifier.

Furthermore, in the embodiment of the comparator shown in FIG. 3, the final state is read as a voltage and the charges must be removed before beginning a comparison again. For such removal, there is provided near each capacitor 1 and 2 a charge removal device formed, for each capacitor, by a gate $G_R$ connected to a potential $\phi_R$ and by a diode D reversely biased by a DC voltage $V_{DD}$. During the whole of the comparison the potential $\phi_R$ is at the low level for preventing charges from passing towards the diodes D, but at the end of the comparison the potential $\phi_R$ is brought to a high level, which allows the charges either under capacitor 1 or under capacitor 2 to be removed towards the corresponding diode.

An analog-digital converter or charge calibrator using a comparator of the type shown in FIGS. 1 to 3 will now be described with reference to FIGS. 4 and 5.

As explained in greater detail hereafter, depending on the type of reading used, the same basic device may be used either as converter or as calibrator. Therefore, in the following description, reference will be more particularly made to an analog-digital converter.

For simplifying the Figures, the analog-digital converter comprises only four levels, but it is obvious for a man skilled in the art that such a converter may easily comprise a larger number of levels.

The analog-digital converter shown in FIG. 4 is formed by the parallel connection of four charge transfer analog comparators of the type described above. Each comparator is formed respectively from capacitors $E_1,S_1;E_2,S_2;E_3,S_3;E_4,S_4$, the passage gate $G_p$ and the amplifier $A_1,A_2,A_3,A_4$, short circuited by the MOS transistor $T_O$ connected to a potential $\phi_O$. As shown in FIG. 4, the different comparator stages are coupled together at the level of the capacitors by passage gates $G_E$ and $G_S$ brought respectively to potentials $\phi_E$ and $\phi_S$. The passage gates $G_E$ and $G_S$ ensure the flow of the charges respectively in the channel of capacitors $E_1,E_2,E_3,E_4$ and in the channel of capacitors $S_1,S_2,S_3,S_4$. These channels are defined by isolation barriers I shown by hatching in FIG. 4. Furthermore, charge storage capacitors $G_1$ and $G_2$ for storing respectively the signal charge and a charge greater than N times the reference charge are provided upstream of each channel corresponding to capacitors $E_1,E_2,E_3,E_4$ and to capacitors $S_1,S_2,S_3,S_4$. Furthermore, a charge removal diode D' connected to the DC voltage $V_{DD}$ is provided down stream of the capacitor $S_4$ receiving the reference charge from the last comparator stage. The role of this diode D' will be explained in detail hereafter.

The operation of the comparator will now be explained with reference more particularly to FIGS. 5a to 5d. First of all, the charge $Q_S$ to be compared which is under the storage gate $G_1$ is introduced into the channel of capacitors $E_1, E_2, E_3, E_4$ and of gates $G_E$. For that, the potential $\phi_E$ applied to gates $G_E$, which was at a low level as shown in FIG. 5b, passes to a high level as shown in FIG. 5c. Thus, the charge $Q_S$ spreads under the gates of capacitors $E_1, E_2, E_3, E_4$ whose maximum storage capacitance $Q_C$ is fixed by the high level of $\phi_E$. The charge $Q_C$ in fact corresponds to the unit charge with which the signal charge $Q_S$ is to be calibrated. In the embodiment, shown, the charge $Q_S$ has filled the potential wells under $E_1$ and $E_2$ but has only filled the potential well under $E_3$ with a charge $Q_r$ less than the charge $Q_C$. At the same time, a charge $Q_{SAT}$ which is chosen greater than N $Q_{ref}$, namely greater than 4 $Q_{ref}$ in the embodiment shown, is introduced into the channel of capacitors $S_1, S_2, S_3, S_4$. The charge $Q_{SAT}$ spreads in the potential wells created under the gates of capacitors $S_1, S_2, S_3, S_4$ whose maximum storage capacitance $Q_{ref}$ is fixed by the high level of the potential $\phi_S$ applied to gates $G_S$. Preferably, the maximum storage capacitance $Q_{ref}$ is chosen so that the charge $Q_C - Q_{ref}$ is greater than 2 $Q_{MIN}$, $Q_{MIN}$ being the sensitivity threshold common to all the comparators. The charge $Q_{SAT}$ fills all the potential wells under the gates of capacitors $S_1, S_2, S_3, S_4$ and the charge excess is removed at the end of the comparator stages towards the diode D′. During this operation of filling the potential wells under the gates of capacitors $E_1, E_2, E_3, E_4$ and $S_1, S_2, S_3, S_4$, the potential $\phi_p$ applied to gate $G_p$ is at the low level and the gates of the capacitors $E_1, E_2, E_3, E_4, S_1, S_2, S_3, S_4$ all receive the voltage $V_I$ common to the comparators by positioning the phase $\phi_O$ at the high level. The voltage $V_I$ is greater than the potentials $\phi_E$ and $\phi_S$, said voltage and the potentials being chosen so as to form well defined charges $Q_C$ and $Q_{ref}$.

It is assumed that the amplifiers $A_1, A_2, A_3, A_4$ which may be formed by two series inverters as in the embodiment shown in FIG. 3, present no dispersion at the levels $V_I$. In the opposite case, it is possible during this filling operation to disconnect them from the gates of capacitors $E_1, E_2, E_3, E_4$ and $S_1, S_2, S_3, S_4$ and to apply to these gates a common voltage $V_G$ through MOS transistors $T'_O$ biased as a triode by the potential $\phi_G$ as shown in FIG. 5a. In fact, so that the analog-digital converter may operate correctly, it is important to form homogeneous charges $Q_C$ and $Q_{ref}$ from one stage to the other.

When the filling operation is finished, the potentials $\phi_E$ and $\phi_S$ applied to the gates $G_E$ and $G_S$ are brought to a low level which isolates the capacitors $E_1, E_2, E_3, E_4$ and respectively the capacitors $S_1, S_2, S_3, S_4$ from each other. Then the points $P_1, P_2, P_3, P_4$ are made floating. The potential $\phi_P$ is then brought to the high level and the four comparisons are effected in parallel at each comparator stage in the same way as for the comparator of FIGS. 1 to 3. In this case, reading of the result may be provided in two ways: either as a voltage, or as a charge.

Reading as a voltage is carried out by reading the output levels of the amplifiers. The N first comparators are at the level "1", namely the first two comparators in the embodiment shown, whereas the other comparator stages are at the level "0". Binary coding is then possible from these N levels.

For reading as a charge, for the whole of the first N wells $S_1, S_2 \ldots S_N$, the charge N $(Q_C + Q_{ref})$ is obtained, the residual charge $Q_R + Q_{ref}$ being in the $(n+1)^{th}$ well E. This charge $n(Q_C + Q_{ref})$ may be recovered for providing the recalibrated charge when the converter is used preferably as a calibrator. If for example $Q_{ref} = Q_C/m$, a charge is obtained at the output equal to $n.(m+1)/m$ $Q_C$ which it is sufficient to divide into two parts $(nQ_C)/m$ and $nQ_C$ in order to obtain the recalibrated charge $nQ_C$.

Charge division may be carried out in a CCD (charge coupled device) channel as described in French Pat. No. 77.28737 published under the No. 2 404 281 or by capacitive division.

The advantage of division in a CCD channel is that a reinjectable charge is obtained directly.

A multilevel charge transfer memory will now be described, referring more particularly to FIG. 6, using comparators in accordance with the present invention associated as a recalibrator.

Memory L is formed by a delay line formed for example by a CCD type charge transfer register. This delay line is looped on itself through the recalibrator. The recalibrator is formed like the analog-digital converter of FIGS. 5 and 4 by N comparator stages associated in parallel. In this case, injection of the charges in the recalibrator is provided either from the memory or from an external injection device and the recalibrated charges are injected directly into the memory.

Consequently, the output of the delay line is connected through a passage 8 not shown to the first capacitor $E_1$ of the recalibrator.

Furthermore, since the comparator stages are read as a charge, the capacitors $S_1, S_2, S_3, S_4$ of the comparator stages are coupled through a passage gate $G'_P$ and an electrode $\Sigma$ to the input of the delay line for injecting therein a calibrated charge n $Q_C$.

Moreover, for recording the signal to be stored, this latter is injected through the diode $D_E$ under a storage gate $G_1$ allowing charge injection in the channel of the capacitors $E_1, E_2, E_3, E_4$ as described for the converter shown in FIG. 4.

In addition, a passage gate $G_{P1}$ and a charge removal diode $D_1$ are positioned downstream of the electrode for removing the non calibrated residual charge as will be explained hereafter. With this type of memory, the charges $Q_S$ are injected a first time through diode $D_E$ and gate $G_1$ under the gates of the capacitors $E_1, E_2, E_3, E_4$ of the calibrator where they are coded in series as was explained with reference to the converter shown in FIGS. 4 and 5. Thus, the coded charge $n.(m+1)/m$ $Q_C$ is available under the gates of the capacitors $S_1, S_2, S_3, S_4$. The contents of the potential wells under the gates of capacitors $S_1, S_2, S_3, S_4$ is summed in parallel under an electrode $\Sigma$ whose channel is shared so that the useful width is equal to $W_s = W_o(m)/m + 1$ $W_o$ being the initial width of the gate $G'_p$ as shown in FIG. 6.

The charge n $Q_C$ is then available at the input of the delay line L whereas the charge n $Q_C/m$ is removed towards the charge removal diode $D_1$ in a way known per se. The charge n $Q_C$ is then recalibrated at each passage and the signal travelling over the delay line may be permanently read on a floating gate G disposed at any position in the line and connected to an amplifier A′.

It is obvious for a man skilled in the art that numerous modifications may be made to the embodiments described above without departing from the scope and spirit of the present invention.

What is claimed is:

1. A charge transfer analog comparator comprising a pair of metal-insulator semiconductor (MIS) capacitors formed by two portions of a commons substrate separated by a passage channel portion, an insulating layer over the substrate and a pair of electrodes over respective ones of said two portions, and a passage gate electrode overlying the passage channel portion for controllably interconnecting the pair of MIS capacitors, an amplifier having an input and an output, the input being connected to one of the pair of electrodes, the output to the other of the pair of electrodes, and means for introducing into one of the pair of capacitors a signal charge and into the other of the pair of capacitors a reference charge for comparison with the signal charge, and means for initiating the comparison connected to the input of the amplifier.

2. The comparator as in claim 1, wherein said means for initiating the comparison is formed by a metal oxide semiconductor transistor whose drain is connected to a DC voltage for positioning the amplifier at the level of its unstable point and whose gate is connected to a source of a periodic potential for enabling said transistor during introduction of the signal charge and the reference charge into the capacitors.

3. The comparator as claimed in claim 2, wherein the drain of said transistor forming the means for initiating the comparison is connected to the output of the said inverter of said two series connected inverters.

4. The comparator as in claim 1, wherein said passage gate is connected to a source of periodic potential for interconnecting said two capacitors after introduction of charges.

5. The comparator as in claim 1, wherein said amplifier is formed by two series connected inverters.

6. The comparator as in claim 1, further comprising means for reading the result of the comparison as a charge.

7. The comparator as in claim 1, further comprising means for reading the result of the comparison as a voltage.

8. The comparator as in claim 7, further comprising a separate charge removal means adjacent each MIS capacitor for removing the charges remaining under the capacitor after the voltage reading of the result of the comparison.

9. The comparator as in claim 8, wherein each charge removal means is formed by a separate passage gate adjacent each MIS capacitor and connected to a source of periodic potential brought to a high level after reading of the result of the comparison and a diode reversely biased by a DC voltage.

10. An analog-digital converter or calibrator comprising N comparator stages as in claim 1, connected in parallel, the MIS capacitors of the N comparators being coupled respectively together by passage gates forming the means for introducing charges into each stage and comprising means for injecting into the first of the N comparator stages the signal charge and a charge at least equal to N times the reference charge.

11. The analog-digital converter or calibrator as claimed in claim 10, further comprising a charge removal device provided downstream of the capacitor storing the reference charge of the last comparator stage.

12. The analog-digital converter or calibrator as claimed in claim 10, wherein said passage gates are connected to a source of periodic potential whose high level defines respectively the value of the calibration charge and the value of a reference charge.

13. Analog-digital converter or calibrator as in claim 12, wherein the calibration charge ($Q_C$) and the reference charge ($Q_{ref}$) are chosen so that the charge ($Q_C - Q_{ref}$) is greater than $2 Q_{MIN}$, $Q_{MIN}$ being the sensitivity threshold common to each of the N comparator stages.

14. The calibrator as in claim 10, wherein, for charge reading, it comprises means for dividing the charge read into two parts so as to obtain a recalibrated charge.

15. A multilevel memory comprising, looped between the output and the input, a calibrator as in claim 10.

* * * * *